United States Patent
Zhang et al.

(10) Patent No.: US 8,464,140 B2
(45) Date of Patent: Jun. 11, 2013

(54) APPARATUS FOR APPENDING CYCLIC REDUNDANCY CHECK IN COMMUNICATION SYSTEM

(75) Inventors: Yujian Zhang, Beijing (CN); Xiaoqiang Li, Beijing (CN)

(73) Assignee: Samsung Electronics Co., Ltd (KR)

( * ) Notice: Subject to any disclaimer, the term of this patent is extended or adjusted under 35 U.S.C. 154(b) by 423 days.

(21) Appl. No.: 12/811,174

(22) PCT Filed: Jan. 7, 2009

(86) PCT No.: PCT/KR2009/000052
§ 371 (c)(1),
(2), (4) Date: Jun. 29, 2010

(87) PCT Pub. No.: WO2009/088207
PCT Pub. Date: Jul. 16, 2009

(65) Prior Publication Data
US 2010/0287457 A1    Nov. 11, 2010

(30) Foreign Application Priority Data
Jan. 7, 2008 (CN) .......................... 2008 1 0002863

(51) Int. Cl.
*H03M 13/00* (2006.01)
(52) U.S. Cl.
USPC ........... 714/781; 714/758; 714/777; 714/782; 714/802
(58) Field of Classification Search
USPC .......................... 714/758, 777, 781, 782, 807
See application file for complete search history.

(56) References Cited

U.S. PATENT DOCUMENTS

| 7,117,419 B2 * | 10/2006 | Nemawarkar et al. ........ 714/758 |
| 7,428,693 B2 * | 9/2008 | Obuchi et al. .................. 714/804 |
| 7,644,347 B2 * | 1/2010 | Alexander et al. ............ 714/799 |
| 2003/0189918 A1 * | 10/2003 | Das et al. ...................... 370/349 |
| 2004/0028020 A1 * | 2/2004 | Frederiksen et al. ......... 370/342 |
| 2004/0158794 A1 * | 8/2004 | Niesen .......................... 714/758 |
| 2008/0320370 A1 * | 12/2008 | Shinagawa et al. ........... 714/777 |

FOREIGN PATENT DOCUMENTS
KR    1020050027679    3/2005

OTHER PUBLICATIONS

J. K. Wolf, R. D. Blakeney, "An exact evaluation of the probability of an undetected error for certain shortened binary CRC codes," Military Communications Conference, 1988, MILCOM 88, Conference record. '21st Century Military Communications—What's Possible?'. 1988 IEEE vol. 1, pp. 287 to 292, Oct. 1, 1988.*

(Continued)

*Primary Examiner* — John J Tabone, Jr.
(74) *Attorney, Agent, or Firm* — The Farrell Law Firm, P.C.

(57) ABSTRACT

The apparatus for appending CRC to the data or signaling to be transmitted in the communication systems is proposed in present invention. If the length of the CRC-bit sequence is 16, one of the CRC generation polynomials listed in present invention can be adopted. If the length of the CRC bit sequence is 18, one of the CRC generation polynomials listed in present invention can be adopted. If the length of the CRC bit sequence is 20, one of the CRC generation polynomials listed in present invention can be adopted. With the optimized CRC generation polynomials proposed in present invention, mistakes in signaling detection can be effectively reduced so that system spectrum utility can be improved.

10 Claims, 4 Drawing Sheets

OTHER PUBLICATIONS

T. Baicheva, S. Dodunekov, P. Kazakov, "Undetected error probability performance of cyclic redundancy-check codes of 16-bit redundancy," IEEE Proc.—Commun., vol. 147. No. 5, pp. 253 to 256, Oct. 2000.*

P. Koopman, "Cyclic Redundancy Code (CRC) Polynomial Selection for Embedded Networks," The International Conference on Dependable System and Networks, DSN-2004.*

G. Funk, "Determination of Best Shortened Codes," IEEE Trans. Commun., vol. 44, No. 1, pp. 1 to 6, Jan. 1996.*

D. Chun, J. K. Wolf, "Special Hardware for Computing the Probability of Undetected Error for Certain CRC Codes and Test Results," IEEE Trans. Commun., vol. 42, No. 10, pp. 2769 to 2772, Oct. 1994.*

G. Castagnoli, S. Brauer, M. Herrmann, "Optimum of Cyclic Redundancy-Check Codes with 24 and 32 Parity Bits," IEEE Trans. Commun., vol. 41, No. 6, pp. 883 to 892, Jun. 1993.*

PCT/ISA/237 Written Opinion issued in PCT/KR2009/000052 (4pp).

* cited by examiner

APPARATUS FOR APPENDING CYCLIC REDUNDANCY CHECK IN COMMUNICATION SYSTEM

BACKGROUND OF THE INVENTION

1. Field of the Invention

The present invention relates to a communication system, especially to an apparatus for appending cyclic redundancy check apparatus in the communication system.

2. Description of the Related Art

Now, 3GPP (the $3^{rd}$ Generation Mobile Communication System Partnership Project) Standardization Organization has commenced on Long-term Evolution (referred to as LTE) to existing system criteria. Among numerous physical layer transmission techniques, both a downlink transmission technique based on OFDM (Orthogonal Frequency Division Multiplexing) and an uplink transmission technique based on SCFDMA (Single Carrier Frequency Division Multiple Access) are in hot research. In nature, OFDM is a multi-carrier modulation communication technique. Its basic principle is to divide a high rate data stream into multiple low rate data streams to transmit via a group of orthogonal sub-carriers simultaneously. Because of the nature of multi-carrier, the OFDM technique bears superior performance in many aspects. SCFDMA is essentially a single carrier transmission technique with comparatively lower PAPR (Peak to Average Power Ratio). Therefore, the power amplifier of a mobile terminal can be operated effectively to enlarge the cell coverage. In addition, with the adoption of cyclic prefix and frequency domain filtering, SCFDMA technique bears comparatively lower processing complexity.

The cyclic redundancy check (CRC) is a hash function for generating a few fixed number of data bits according to data such as network data packets or computer file bock. It is adopted to detect possible error for data transmission or data storage. CRC is calculated before the data transmission or data storage and is appended at the end of the data. And in a receiver, the data is checked whether it is changed or not.

One CRC calculation is as follows. Suppose sequence $a_0, a_1, a_2, a_3, \ldots, a_{A-1}$ is input into a CRC calculation module and a generated check-bit sequence is $p_0, p_1, p_2, p_3, \ldots, p_{L-1}$, where A indicates a length of the input sequence, and L indicates a length of the check-bit sequence. Then, a sequence appended with check bits is $a_0, a_1, a_2, a_3, \ldots, a_{A-1}, p_0, p_1, p_2, p_3, \ldots, p_{L-1}$. The check bits are calculated as follows: in GF(2), a polynomial expression $a_0 D^{A+L-1} + a_1 D^{A+L-2} + \ldots + a_{A-1} D^L + p_0 D^{L-1} + p_1 D^{L-2} + \ldots + p_{L-2} D^1 + p_{L-1}$ is divided by corresponding generation polynomial, and a remainder must be zero.

At present, the CRC generation polynomials applied in LTE are as follows: if the length of CRC L=16, the CRC generation polynomial $g_{CRC16}(D) = D^{16} + D^{12} + D^5 + 1$; if the length of CRC L=24, the CRC generation polynomials are $g_{CRC24A}(D) = D^{24} + D^{23} + D^{18} + D^{17} + D^{14} + D^{11} + D^{10} + D^7 + D^6 + D^5 + D^4 + D^3 + D + 1$ and $g_{CRC24B}(D) = D^{24} + D^{23} + D^6 + D^5 + D + 1$.

In current LTE, a DCI processing flow is illustrated in FIG. 1. In module 101, DCI adds the CRC in the data sequence. Suppose load information for PDCCH is $a_0, a_1, a_2, a_3, \ldots, a_{A-1}$. The check-bit sequence generated according to the CRC generation polynomial is $p_0, p_1, p_2, p_3, \ldots, p_{L-1}$, where A indicates the length of the load information and L indicates the length of the check-bit sequence. Suppose the sequence appended with CRC is $b_0, b_1, b_2, b_3, \ldots, b_{B-1}$, where B=A+L. Then the relationships between $a_k$, $b_k$ and $p_k$ are as follows:

$$b_k = a_k \quad k = 0, 1, 2, \ldots, A-1$$
$$b_k = p_{k-A} \quad k = A, A+1, A+2, \ldots, A+L-1$$

After appending the CRC, a scrambling process is performed on the CRC check-bit sequence with the user equipment (UE) ID sequence $x_{ue,0}, x_{ue,1}, \ldots, x_{ue,15}$ to form a sequence $c_0, c_1, c_2, c_3, \ldots, c_{B-1}$. The relationship between $b_k$ and $c_k$ is as follows:

$$c_k = b_k \quad k = 0, 1, 2, \ldots, A-1$$
$$c_k = (b_k + x_{ue,k-A}) \bmod 2 \quad k = A, A+1, A+2, \ldots, A+15$$

A channel coding is performed on the sequence $c_0, c_1, c_2, c_3, \ldots, c_{B-1}$ in module 102. In LTE, a convolution coding scheme is applied. A rate matching is performed on the encoded data in module 103.

At present, an existed problem is that the adopted CRC generation polynomial is not optimal. Suppose the length of the load information for the PDCCH is A and L is the length of the check-bit sequence. Then the CRC corresponds to a linear block code (A+L, A). One technical index of the CRC generation polynomial is $P_{ue}$. $P_{ue}$ can be defined as a probability that a linear block codeword is detected by error as another codeword after the channel transmission. A Binary Symmetric Channel (BSC) is taken as an example in following description.

The performance of $g_{CRC16}(D) = D^{16} + D^{12} + D^5 + 1$ is illustrated in FIG. 2. In this figure, x-axis indicates an error probability ($\epsilon$) in BSC, y-axis indicates a corresponding $P_{ue}$. The four curves in this figure corresponds to the cases A=16, 24, 32 and 48 respectively. From this figure, it is obviously seen: when $\epsilon$ is within the range [0.05, 0.3], $P_{ue}$ is even greater than that when $\epsilon = 0.5$. This means that the performance of the generation polynomial is very poor within the range.

SUMMARY OF THE INVENTION

The object of this invention is to provide an apparatus for appending a CRC in a communication system. With this apparatus, the CRC is appended to transmitted data or signaling. If a length of the CRC-bit sequence is 16, one of CRC generation polynomials listed below is adopted in present application:

$D^{16}+D^{15}+D^{12}+D^9+D^6+D^3+D^2+1$
$D^{16}+D^{14}+D^{13}+D^{10}+D^7+D^4+D+1$
$D^{16}+D^{15}+D^{14}+D^{12}+D^{11}+D^8+D^7+D^6+D^5+D^4+D^3+1$
$D^{16}+D^{13}+D^{12}+D^{11}+D^{10}+D^9+D^8+D^5+D^4+D^2+D+1$
$D^{16}+D^{15}+D^{12}+D^{10}+D^9+D^8+D^7+D^6+D^5+D^3+D^2+1$
$D^{16}+D^{14}+D^{13}+D^{11}+D^{10}+D^9+D^8+D^7+D^6+D^4+D+1$
$D^{16}+D^{15}+D^{14}+D^{12}+D^{11}+D^9+D^8+D^7+D^6+D^5+D^4+1$
$D^{16}+D^{12}+D^{11}+D^{10}+D^9+D^8+D^7+D^5+D^4+D^2+D+1$

If the length of the CRC bit sequence is 18, one of the CRC generation polynomials listed below is adopted in present application:

$D^{18}+D^{16}+D^{14}+D^{10}+D^9+D^8+D^4+1$
$D^{18}+D^{14}+D^{10}+D^9+D^8+D^4+D^2+1$
$D^{18}+D^{16}+D^{15}+D^{12}+D^9+D^8+D^5+1$
$D^{18}+D^{13}+D^{10}+D^9+D^6+D^3+D^2+1$
$D^{18}+D^{17}+D^{11}+D^{10}+D^9+D^8+D^6+1$
$D^{18}+D^{12}+D^{10}+D^9+D^8+D^7+D+1$
$D^{18}+D^{17}+D^{16}+D_{14}+D^{11}+D^9+D^8+D^5+D^3+1$
$D^{18}+D^{15}+D^{13}+D^{10}+D^9+D^7+D^4+D^2+D+1$

If the length of the CRC bit sequence is 20, one of the CRC generation polynomials listed below is adopted in present application:

$D^{20}+D^{19}+D^{18}+D^{17}+D^{15}+D^{14}+D^{12}+D^{11}+D^{10}+D^8+D^7+D^6+D^4+1$ $D^{20}+D^{16}+D^{14}+D^{13}+D^{12}+D^{10}+D^9+D^8+D^6+D^5+D^3+D^2+D+1$ $D^{20}+D^{19}+D^{14}+D^{13}+D^{11}+D^7+D^6+D^5+D^3+D^2+D+1$ $D^{20}+D^{19}+D^{18}+D^{17}+D^{15}+D^{14}+D^{13}+D^9+D^7+D^6+D+1$ $D^{20}+D^{18}+D^{17}+D^{16}+D^{11}+D^9+D^8+D^7+D^6+D^3+D^2+1$ $D^{20}+D^{18}+D^{17}+D^{14}+D^{13}+D^{12}+D^{11}+D^9+D^4+D^3+D^2+1$ $D^{20}+D^{19}+D^{17}+D^{13}+D^{12}+D^{10}+D^9+D^8+D^7+D^6+D^3+D^2+D+1$ $D^{20}+D^{19}+D^{18}+D^{17}+D^{14}+D^{13}+D^{12}+D^{11}+D^{10}+D^8+D^7+D^3+D+1$

With the optimized CRC generation polynomials proposed in present invention, mistakes in signaling detection can be effectively reduced so that system spectrum utility can be improved.

DETAILED DESCRIPTION OF THE PREFERRED EMBODIMENTS

Suppose the load information for data or signaling is $a_0, a_1, a_2, a_3, \ldots, a_{A-1}$, and the CRC sequence to be appended to data or signaling is $p_0, p_1, p_2, p_3, \ldots, p_{L-1}$, where A indicates the length of the load information and L indicates the length of the check bit sequence (for the 16-bit check information, L=16; for the 18-bit check information, L=18; and for the 20-bit check information, L=20). The check-bit sequence is calculated with the method below: in GF(2), the polynomial $a_0 D^{A+L-1}+a_1 D^{A+L-2}+ \ldots +a_{A-1}D^L+p_0 D^{L-1}+p_1 D^{L-2}+ \ldots + p_{L-2}D^1+p_{L-1}$ is divided by corresponding generation polynomials. And the remainders are zeros. Suppose the sequence appended with CRC is $b_0, b_1, b_2, b_3, \ldots, b_{B-1}$, where B=A+L. Then the relationships between $a_k$, $b_k$ and $p_k$ are as follows:

$$b_k = a_k \quad k = 0, 1, 2, \ldots, A-1$$
$$b_k = p_{k-A} \quad k = A, A+1, A+2, \ldots, A+L-1$$

Several optimized CRC generation polynomials that bear superior performance to existing one are proposed in present invention.

In the case that the length of the CRC bit sequence is 16, one of the CRC generation polynomials listed below is adopted in our application:

$D^{16}+D^{15}+D^{12}+D^9+D^6+D^3+D^2+1$ $D^{16}+D^{14}+D^{13}+D^{10}+D^7+D^4+D+1$ $D^{16}+D^{15}+D^{14}+D^{12}+D^{11}+D^8+D^7+D^6+D^5+D^4+D^3+1$ $D^{16}+D^{13}+D^{12}+D^{11}+D^{10}+D^9+D^8+D^5+D^4+D^2+D+1$ $D^{16}+D^{15}+D^{12}+D^{10}+D^9+D^8+D^7+D^6+D^5+D^3+D^2+1$ $D^{16}+D^{12}+D^{11}+D^{10}+D^9+D^8+D^7+D^5+D^4+D^2+D+1$ $D^{16}+D^{15}+D^{14}+D^{12}+D^{11}+D^9+D^8+D^7+D^6+D^5+D^4+1$ $D^{16}+D^{12}+D^{11}+D^{10}+D^9+D^8+D^7+D^5+D^4+D^2+D+1$

In the case that the length of the CRC bit sequence is 18, one of the CRC generation polynomials listed below is adopted in our application:

$D^{18}+D^{16}+D^{14}+D^{10}+D^9+D^8+D^4+1$ $D^{18}+D^{14}+D^{10}+D^9+D^8+D^4+D^2+1$ $D^{18}+D^{16}+D^{15}+D^{12}+D^9+D^8+D^5+1$ $D^{18}+D^{13}+D^{10}+D^9+D^6+D^3+D^2+1$ $D^{18}+D^{17}+D^{11}+D^{10}+D^9+D^8+D^6+1$ $D^{18}+D^{12}+D^{10}+D^9+D^8+D^7+D+1$ $D^{18}+D^{17}+D^{16}+D^{14}+D^{11}+D^9+D^8+D^5+D^3+1$ $D^{18}+D_{15}+D^{13}+D^{10}+D^9+D^7+D^4+D^2+D+1$

In the case that the length of the CRC bit sequence is 20, one of the CRC generation polynomials listed below is adopted in our application:

$D^{20}+D^{19}+D^{18}+D^{17}+D^{15}+D^{14}+D^{12}+D^{11}+D^{10}+D^8+D^7+D^6+D^4+1$ $D^{20}+D^{16}+D^{14}+D^{13}+D^{12}+D^{10}+D^9+D^8+D^6+D^5+D^3+D^2+D+1$ $D^{20}+D^{19}+D^{14}+D^{13}+D^{11}+D^7+D^6+D^5+D^3+D^2+D+1$ $D^{20}+D^{19}+D^{18}+D^{17}+D^{15}+D^{14}+D^{13}+D^9+D^7+D^6+D+1$ $D^{20}+D^{18}+D^{17}+D^{16}+D^{11}+D^9+D^8+D^7+D^6+D^3+D^2+1$ $D^{20}+D^{18}+D^{17}+D^{14}+D^{13}+D^{12}+D^{11}+D^9+D^4+D^3+D^2+1$ $D^{20}+D^{19}+D^{17}+D^{13}+D^{12}+D^{10}+D^9+D^8+D^7+D^6+D^3+D^2+D+1$ $D^{20}+D^{19}+D^{18}+D^{17}+D^{14}+D^{13}+D^{12}+D^{11}+D^{10}+D^8+D^7+D^3+D+1$

Figure 1:
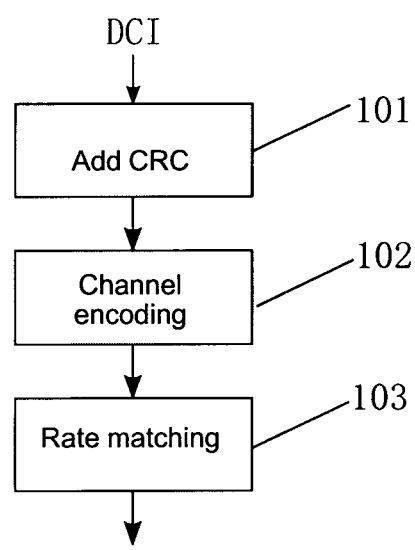
FIG. 1 shows a DCI processing flow.
Figure 2:
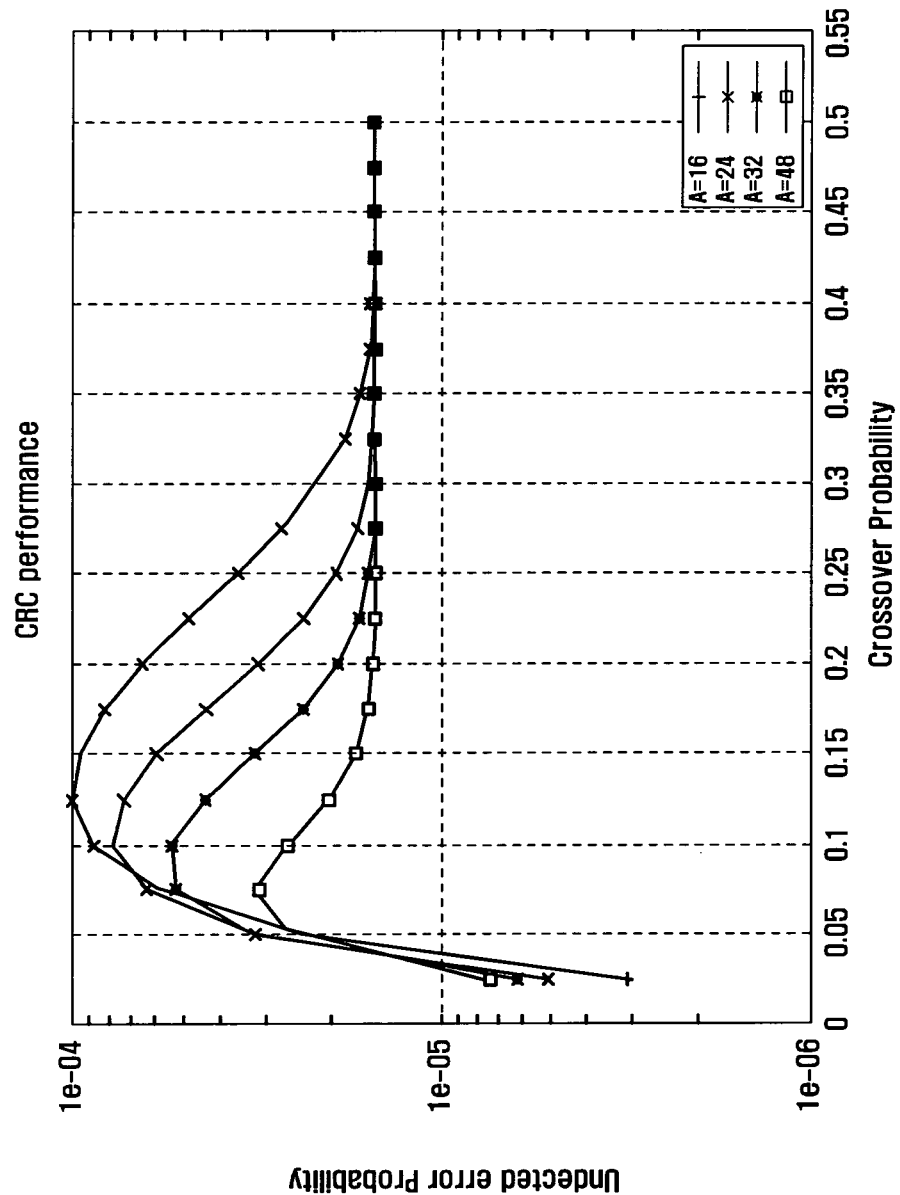
FIG. 2 shows a performance of existing CRC generation polynomials.
Figure 3:
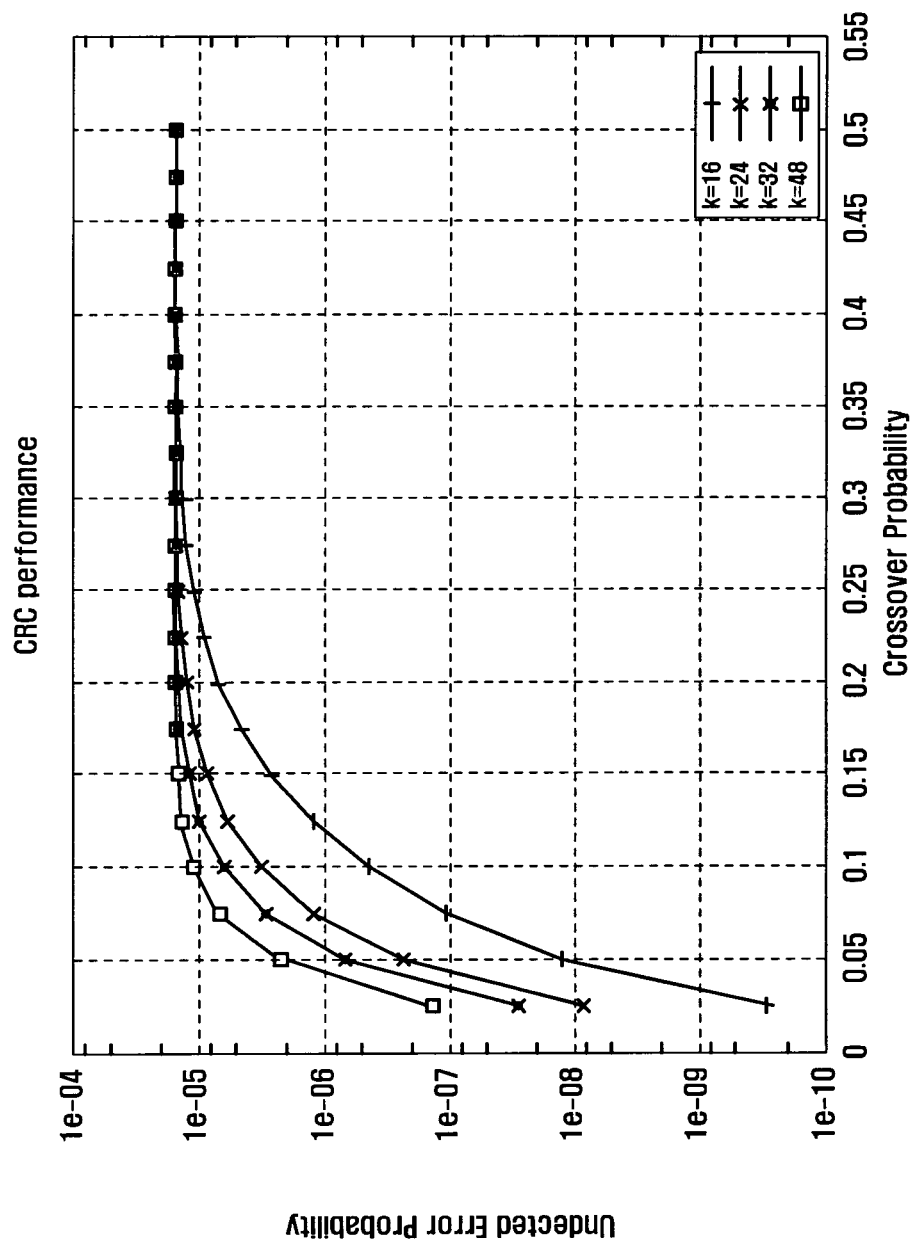
FIG. 3 shows a performance of CRC generation polynomial $D^{16}+D^{15}+D^{14}+D^{12}+D^{11}+D^9+D^8+D^7+D^6+D^5+D^4+1$.

The CRC bit sequence with the length of 16 is taken as an example in following description. The 16-bit CRC generation polynomial bears superior performances to existing one $g_{CRC16}(D)=D^{16}+D^{12}+D^5+1$. The generation polynomial $D^{16}+D^{15}+D^{14}+D^{12}+D^{11}+D^9+D^8+D^7+D^6+D^5+D^4+1$ is taken as an example. Its performance is shown in FIG. 3. From this figure, it can be seen that: the generation polynomial has no limitation existed in $g_{CRC16}(D)$ (i.e., when $\epsilon$ is within the range [0.05, 0.3], $P_{ue}$ is even greater than the $P_{ue}$ when $\epsilon=0.5$). Meanwhile, from a comparison between FIG. 2 and FIG. 3, it can be seen that: generation polynomial $D^{16}+D^{15}+D^{14}+D^{12}+D^{11}+D^9+D^8+D^7+D^6+D^5+D^4+1$ bears significantly better performance than $g_{CRC16}(D)=D^{16}+D^{12}+D^5+1$ (for the same A and $\epsilon$, the less the $P_{ue}$ is, the better the performance is.)

One application scenario is to apply present invention in data transmission in a communication system. For example, in the case that a base station (BS) transmits data to a user equipment (UE) or UE transmits data to a BS, if the length of the CRC bit sequence is 16, 18 or 20, the CRC generation polynomials proposed in present invention can adopted for the invention.

Another application scenario is to apply present invention in the transmission of control signaling in a communication system. In a communication system, the BS controls resource allocation and the transmitting and receiving for the to UEs by transmitting control signaling at each scheduling moment. In present invention, the control signaling for each UE is called a Physical Downlink Control Channel (PDCCH). And the load information in PDCCH is called a Downlink Control Information (DCI).

With the CRC generation polynomials proposed in present invention, a method for transmitting control signaling includes steps of:

Step a) BS generating the check information on the control signaling according to the load information on the control signaling and the optimized CRC generation polynomial.

Suppose the load information on the control signaling is $a_0, a_1, a_2, a_3, \ldots, a_{A-1}$, and the check-bit sequence generated according to the CRC generation polynomial is $p_0, p_1, p_2, p_3, \ldots, p_{L-1}$, where A is the length of the load information, and L is the length of the check-bit sequence (for the 16-bit check information, L=16, for the 18-bit check information, L=18, and for the 20-bit check information, L=20). The check-bit sequence is calculated with the method below: in GF(2), the polynomial $a_0D^{A+L-1}+a_1D^{A+L-2}+ \ldots +a_{A-1}D^L+p_0D^{L-1}+p_1D^{L-2}+ \ldots +p_{L-2}D^1+p_{L-1}$ is divided by corresponding generation polynomials. And the remainders are zeros. Suppose the sequence appended with CRC is $b_0, b_1, b_2, b_3, \ldots, b_{B-1}$, where B=A+L. Then the relationships between $a_k$, $b_k$ and $p_k$ are as follows:

$$b_k = a_k \quad k = 0, 1, 2, \ldots, A-1$$
$$b_k = p_{k-A} \quad k = A, A+1, A+2, \ldots, A+L-1$$

Figure 4:
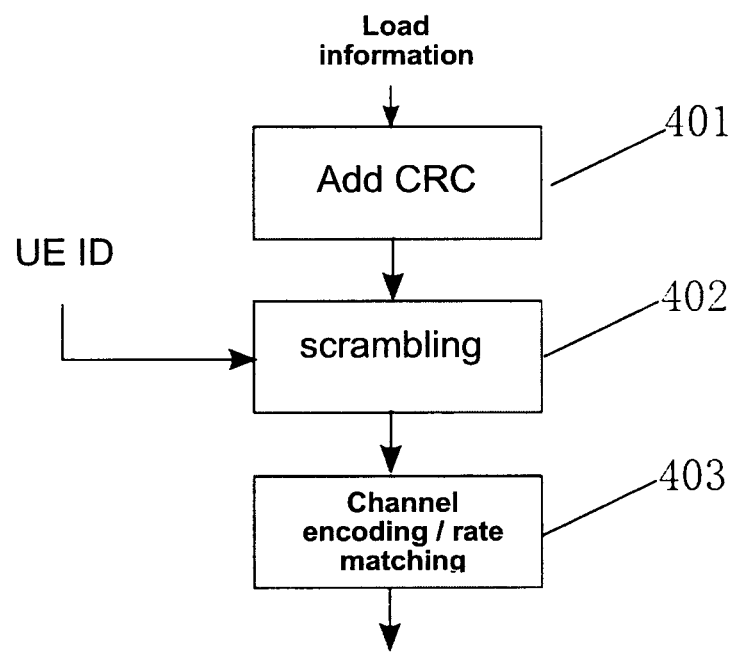
FIG. 4 shows a flow of processing the 16-bit check information.
Figure 5:
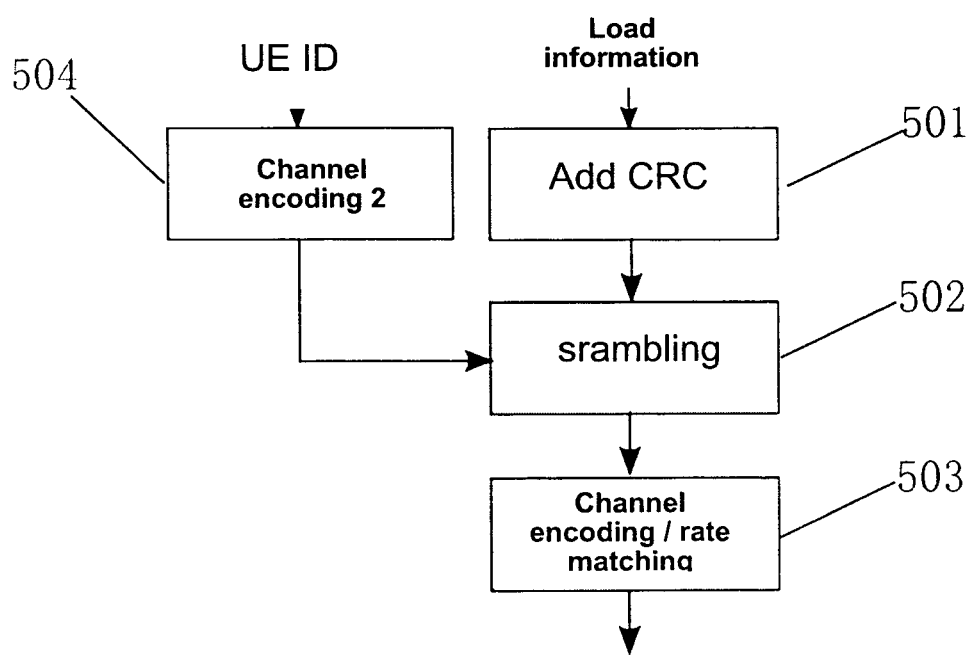
FIG. 5 shows a flow of processing the 18-bit or 20-bit check information.

FIG. 4 shows a flow of processing the 16-bit check information. FIG. 5 shows a flow of processing the 18-bit or 20-bit check information. In the case that the check information is 16 bits long, the operations in step a) correspond to that implemented in module 401 (CRC appending) in FIG. 4. In the case that the check information is 18 bits long or 20 bits long, the operations in step a) correspond to that implemented in module 501 (CRC appending) in FIG. 5.

Step b) BS performing the scrambling operation on the check information with the information obtained according to UE ID.

In the case that the check information is 16 bits long, since UE ID bears the same length as the check information, BS directly performs the scrambling operation on the check information with the UE ID. This process is implemented in module 402 (scrambling) in FIG. 4. Details are described as follows. Suppose the sequence appended with CRC is $b_0, b_1, b_2, b_3, \ldots, b_{B-1}$, where B=A+L with A indicating the length of the load information and L indicating the length of the check-bit sequence. Then sequence $c_0, c_1, c_2, c_3, \ldots, c_{B-1}$ obtained by scrambling the CRC bit sequence with the UE ID $x_{ue,0}, x_{ue,1}, \ldots, x_{ue,15}$. And the relationship between $b_k$ and $c_k$ is as follows:

$$c_k = b_k \quad k = 0, 1, 2, \ldots, A-1$$
$$c_k = (b_k + x_{ue,k-A}) \bmod 2 \quad k = A, A+1, A+2, \ldots, A+15$$

In the case that the check information is 18 bits long or 20 bits long, since the UE ID is 16 bits long, it is necessary to expand the UE ID to be the same length as the check information. One method is to perform channel coding to the UE ID. This process is implemented in module 504 (channel coding 2) in FIG. 5. For example, the check information is 18 bits long, the linear block code encoding scheme (18,16) can be adopted here to expand the UE ID to be a 18-bit codeword. In the case that the check information is 20 bits long, the linear block code encoding scheme (20,16) can be adopted to expand the UE ID to be a 20-bit codeword. The subsequent scrambling operation is implemented in module 502 (scrambling operation) in FIG. 5. The details are as follows. Suppose the sequence appended with CRC is $b_0, b_1, b_2, b_3, \ldots, b_{B-1}$, where B=A+L with A indicating the length of the check information and L the length of the check-bit sequence. Suppose the UE ID $x_{ue,0}, x_{ue,1}, \ldots, x_{ue,15}$ is encoded to be the sequence $y_0, y_1, y_2, y_3, \ldots, y_{L-1}$, the sequence $c_0, c_1, c_2, c_3, \ldots, c_{B-1}$ is obtained by scrambling operation the CRC sequence with the information sequence $y_0, y_1, y_2, y_3, \ldots, y_{L-1}$ obtained according to UE ID. And the relationship between $b_k$ and $c_k$ is as follows:

$$c_k = b_k \quad k = 0, 1, 2, \ldots, A-1$$
$$c_k = (b_k + y_{k-A}) \bmod 2 \quad k = A, A+1, A+2, \ldots, A+L-1$$

Step c) implementing operations of channel coding, rate matching on the load information and the scrambled information obtained in step b). Then the processed information is transmitted by the BS.

In this step, channel coding and rate matching are implemented by BS on the scrambled information $c_0, c_1, c_2, c_3, \ldots, c_{B-1}$ obtained in step b) and then the processed information is transmitted. Here, a convolution coding scheme or any other can be adopted.

In the case that the check information is 16 bits long, the operations in step c) correspond to that operated in module 403 (channel coding/rate matching) in FIG. 4. And in the case that the check information is 18 or 20 bits long, the operations in step c) correspond to that operated in module 503 (channel coding/rate matching) in FIG. 5.

EMBODIMENTS

Four embodiments of the present invention are described in the following. To avoid making the description too tedious, detailed descriptions for functions or equipments well known are omitted.

A First Embodiment

In this embodiment, the transmission control signaling shares the same length with the check information, i.e., 16 bits. Suppose the adopted CRC generation polynomial is $D^{16}+D^{15}+D^{14}+D^{12}+D^{11}+D^9+D^8+D^7+D^6+D^5+D^4+1$, and the UE ID is $x_{ue,0}, x_{ue,1}, \ldots, x_{ue,15}$=1000110000101111, the load information on the control signaling is the 20-bit sequence $a_0, a_1, a_2, a_3, \ldots, a_{19}$=00011111001010011110. Please be noted that all these settings are only done for the convenience of description. Any other of the CRC generation polynomials proposed in present invention, UE IDs, and load information sequences of control signaling can be applied.

The check-bit sequence generated according to the load information on the control signaling and the optimized CRC generation polynomial is $p_0, p_1, p_2, p_3, \ldots, p_{15}$=0001010000000001. Then the sequence appended with CRC is $b_0, b_1, b_2, b_3, \ldots, b_{35}$=000111110010100111000010100000000001. The scrambling operation is performed on the CRC bit sequence with the UE ID to obtain a scrambled sequence $c_0, c_1, c_2, c_3, \ldots, c_{35}$=000111110010100111101001100000101110. Then, operations of channel coding and rate matching are performed by BS on sequence $c_0, c_1, c_2, c_3, \ldots, c_{35}$. And the processed information is finally transmitted.

A Second Embodiment

In this embodiment, the transmission control signaling shares the same length with the check information, i.e., 18 bits. Suppose the adopted CRC generation polynomial is $D^{18}+D^{16}+D^{14}+D^{10}+D^9+D^8+D^4+1$, and the UE ID is $x_{ue,0}, x_{ue,1}, \ldots, x_{ue,15}$=1000110000101111 the load information on the control signaling is the 20-bit sequence $a_0, a_1, a_2, a_3, \ldots, a_{19}$=00011111001010011110. Please be noted that all these settings are only done for the convenience of description. Any other of the CRC generation polynomials proposed in present invention, UE IDs, and load information sequences of control signaling can be applied.

The check-bit sequence generated according to the load information on the control signaling and the optimized CRC generation polynomial is $p_0$, $p_1$, $p_2$, $p_3$, ..., $p_{17}$=111010001110001111. Then the sequence appended with CRC is $b_0$, $b_1$, $b_2$, $b_3$, ..., $b_{37}$=0001111100101001111011101000111000111. By systematic linear block coding, the UE ID $x_{ue,0}$, $x_{ue,1}$, ..., $x_{ue,15}$ is converted to the sequence $y_0$, $y_1$, $y_2$, $y_3$, ..., $y_{17}$. The coding rule is as follows:

$$y_k = x_{ue,k} \quad k = 0, 1, 2, \ldots, 15$$

$$y_{16} = \left(\sum_{k=0}^{7} x_{ue,k}\right) \bmod 2$$

$$y_{17} = \left(\sum_{k=8}^{7} x_{ue,k}\right) \bmod 2$$

Therefore by the UE ID $x_{ue,0}$, $x_{ue,1}$, ..., $x_{ue,15}$=1000110000101111, the encoded sequence $y_0$, $y_1$, $y_2$, $y_3$, ..., $y_{17}$=100011000010111111 can be obtained. The scrambling operation is performed on CRC bit sequence with sequence $y_0$, $y_1$, $y_2$, $y_3$, ..., $y_{17}$ to obtain sequence $c_0$, $c_1$, $c_2$, $c_3$, ..., $c_{37}$=000111110010100111100110010011 00110000. Then, operations like channel coding and rate matching are performed by BS on the sequence $c_0$, $c_1$, $c_2$, $c_3$, ..., $c_{37}$. And the processed information is finally transmitted.

A Third Embodiment

In this embodiment, the transmission control signaling shares the same length with the check information, i.e., 20 bits. Suppose the adopted CRC generation polynomial is $D^{20}+D^{19}+D^{18}+D^{17}+D^{15}+D^{14}+D^{12}+D^{11}+D^{10}+D^8+D^7+D^6+D^4+1$, and the UE ID is $x_{ue,0}$, $Xx_{ue,1}$, ..., $x_{ue,15}$=1000110000101111, the load information on the control signaling is the 20-bit sequence=$a_0$, $a_1$, $a_2$, $a_3$, ..., $a_{19}$=00011111001010011110. Please be noted that all these settings are only done for the convenience of description. Any other of the CRC generation polynomials proposed in present invention, UE IDs, and load information sequences of control signaling can be applied.

The check-bit sequence generated according to the load information on the control signaling and the optimized CRC generation polynomial is $p_0$, $p_1$, $p_2$, $p_3$, ..., $p_{19}$=10110010110010001100. Then the sequence appended with CRC is $b_0$, $b_1$, $b_2$, $b_3$, ..., $b_{39}$=0001111100101001111010110010110010001100. By systematic linear block coding, the UE ID $x_{ue,0}$, $x_{ue,1}$, ..., $x_{ue,15}$ is converted to the sequence $y_0$, $y_1$, $y_2$, $y_3$, ..., $y_{19}$. The coding rule is as follows:

$$y_k = x_{ue,k} \quad k = 0, 1, 2, \ldots, 15$$

$$y_{16} = \left(\sum_{k=0}^{3} x_{ue,k}\right) \bmod 2$$

$$y_{17} = \left(\sum_{k=14}^{7} x_{ue,k}\right) \bmod 2$$

$$y_{18} = \left(\sum_{k=8}^{L} x_{ue,k}\right) \bmod 2$$

$$y_{19} = \left(\sum_{k=12}^{L} x_{ue,k}\right) \bmod 2$$

So, by the UE ID $x_{ue,0}$, $x_{ue,1}$, ..., $x_{ue,15}$=1000110000101111, the encoded sequence $y_0$, $y_1$, $y_2$, $y_3$, ..., $y_{19}$=10001100001011111010 is obtained. The scrambling operation is performed on the CRC bit sequence with sequence $y_0$, $y_1$, $y_2$, $y_3$, ..., $y_{19}$ to obtain sequence $c_0$, $c_1$, $c_2$, $c_3$, ..., $c_{39}$=0001111100101001111000111110111001110110. Then, operations of channel coding and rate matching are performed by BS to sequence $c_0$, $c_1$, $c_2$, $c_3$, ..., $c_{39}$. And the processed information is finally transmitted.

A Fourth Embodiment

This embodiment corresponds to the case of data transmission. For example, in the case that BS transmits data to UE or UE transmits data to BS, if the CRC sequence is 16, 18 or 20 bits long, the CRC generation polynomials proposed in present invention can be applied here. For example: in the case that the CRC sequence is 16 bits long, the generation polynomial $D^{16}+D^{15}+D^{14}+D^{12}+D^{11}+D^9+D^8+D^7+D^6+D^5+D^4+1$ can be applied; and in the case that the CRC sequence is 18 bits long, the generation polynomial $D^{18}+D^{16}+D^{14}+D^{10}+D^9+D^8+D^4D+1$ can be applied; and in the case that the CRC sequence is 20 bits long, the generation polynomial $D^{20}+D^{19}+D^{18}+D^{17}+D^{15}D^{14}+D^{12}+D^{11}+D^{10}+D^8+D^7+D^6+D^4+1$ can be applied.

While the invention has been shown and described with reference to certain exemplary embodiments of the present invention thereof, it will be understood by those skilled in the art that various changes in form and details may be made therein without departing from the spirit and scope of the present invention as defined by the appended claims and their equivalents.

What is claimed is:

1. An apparatus for appending Cyclic Redundancy Check (CRC) bits to data or signaling to be transmitted in a communication system, the apparatus comprising:
    a controller that determines a length of a CRC-bit sequence, adopts a CRC generation polynomial, generates the CRC-bit sequence using the adopted CRC generation polynomial, and appends the generated CRC-bit sequence to the data or the signaling: and
    a transmitter that transmits the data or the signaling having the appended CRC-bit sequence,
    wherein if the length of the CRC-bit sequence is 16 bits, one of CRC generation polynomials listed below is adopted:
    $D^{16}+D^{15}+D^{12}+D^9+D^6+D^3+D^2+1$
    $D^{16}+D^{14}+D^{13}+D^{10}+D^7+D^4+D+1$
    $D^{16}+D^{15}+D^{14}+D^{12}+D^{11}+D^8+D^7+D^6+D^5+D^4+D^3+1$
    $D^{16}+D^{13}+D^{12}+D^{11}+D^{10}+D^9+D^8+D^5+D^4+D^2+D+1$
    $D^{16}+D^{15}+D^{12}+D^{10}+D^9+D^8+D^7+D^6+D^5+D^3+D^2+1$
    $D^{16}+D^{14}+D^{13}+D^{11}+D^{10}+D^9+D^8+D^7+D^6+D^4+D+1$
    $D^{16}+D^{15}+D^{14}+D^{12}+D^{11}+D^9+D^8+D^7+D^6+D^5+D^4+1$
    $D^{16}+D^{12}+D^{11}+D^{10}+D^9+D^8+D^7+D^5+D^4+D^2+D+1$;

if the length of the CRC bit sequence is 18 bits, one of CRC generation polynomials listed below is adopted:

$D^{18}+D^{16}+D^{14}+D^{10}+D^9+D^8+D^4+1$
$D^{18}+D^{14}+D^{10}+D^9+D^8+D^4+D^2+1$
$D^{18}+D^{16}+D^{15}+D^{12}+D^9+D^8+D^5+1$
$D^{18}+D^{13}+D^{10}+D^9+D^6+D^3+D^2+1$
$D^{18}+D^{17}+D^{11}+D^{10}+D^9+D^8+D^6+1$
$D^{18}+D^{12}+D^{10}+D^9+D^8+D^7+D+1$
$D^{18}+D^{17}+D^{16}+D^{14}+D^{11}+D^9+D^8+D^5+D^3+1$
$D^{18}+D^{15}+D^{13}+D^{10}+D^9+D^7+D^4+D^2+D+1$;

if the length of the CRC bit sequence is 20 bits, one of CRC generation polynomials listed below is adopted:

$D^{20}+D^{19}+D^{18}+D^{17}+D^{15}+D^{14}+D^{12}+D^{11}+D^{10}+D^8+D^7+D^6+D^4+1$
$D^{20}+D^{16}+D^{14}+D^{13}+D^{12}+D^{10}+D^9+D^8+D^6+D^5+D^3+D^2+D+1$
$D^{20}+D^{19}+D^{14}+D^{13}+D^{11}+D^7+D^6+D^5+D^3+D^2+D+1$
$D^{20}+D^{19}+D^{18}+D^{17}+D^{15}+D^{14}+D^{13}+D^9+D^7+D^6+D+1$
$D^{20}+D^{18}+D^{17}+D^{16}+D^{11}+D^9+D^8+D^7+D^6+D^3+D^2+1$
$D^{20}+D^{18}+D^{17}+D^{14}+D^{13}+D^{12}+D^{11}+D^9+D^4+D^3+D^2+1$
$D^{20}+D^{19}+D^{17}+D^{13}+D^{12}+D^{10}+D^9+D^8+D^7+D^6+D^3+D^2+D+1$
$D^{20}+D^{19}+D^{18}+D^{17}+D^{14}+D^{13}+D^{12}+D^{11}+D^{10}+D^8+D^7+D^3+D+1$.

2. The apparatus according to claim 1, wherein the controller is configured to
  a) generate check information on a control signaling according to load information on the control signaling and a optimized CRC generation polynomial;
  b) perform scrambling operation on the check information with information obtained according to a User Equipment (UE) IDentifier (ID);
  c) implement operations of channel coding, rate matching on the load information and the scrambled information obtained in step b), and then transmitting the processed information via the transmitter.

3. The apparatus according to claim 2, wherein the control signaling comprises a physical downlink control channel (PDCCH).

4. The apparatus according to claim 2, wherein the load information comprises downlink control information (DCI).

5. The apparatus according to claim 2, wherein a length of the check information is 16 bits.

6. The apparatus according to claim 2, wherein a Base Station (BS) directly scrambles the check information with the UE ID.

7. The apparatus according to claim 2, wherein a length of the check information is 18 bits.

8. The apparatus according to claim 2, wherein a Base Station (BS) encodes the UE ID to be a 18-bit codeword, and then scrambles the encoded UE ID with the check information.

9. The apparatus according to claim 2, wherein a length of the check information is 20 bits.

10. The apparatus according to claim 2, wherein a Base Station (BS) encodes the UE ID to be a 20-bit codeword, and then scrambles the encoded UE ID with the check information.

* * * * *

UNITED STATES PATENT AND TRADEMARK OFFICE
CERTIFICATE OF CORRECTION

| | | |
|---|---|---|
| PATENT NO. | : 8,464,140 B2 | Page 1 of 1 |
| APPLICATION NO. | : 12/811174 | |
| DATED | : June 11, 2013 | |
| INVENTOR(S) | : Yujian Zhang et al. | |

It is certified that error appears in the above-identified patent and that said Letters Patent is hereby corrected as shown below:

On the Title Page, Item (30) Foreign Application Priority Data

"2008 1 0002863" should be -- 2008 1 0002863.7 --

Signed and Sealed this
Twenty-eighth Day of January, 2014

Michelle K. Lee
*Deputy Director of the United States Patent and Trademark Office*